(12) United States Patent
Trivedi et al.

(10) Patent No.: US 6,707,320 B2
(45) Date of Patent: Mar. 16, 2004

(54) CLOCK DETECT INDICATOR

(75) Inventors: Pradeep Trivedi, Sunnyvale, CA (US); Gin Yee, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/997,866

(22) Filed: Nov. 30, 2001

(65) Prior Publication Data

US 2003/0102899 A1 Jun. 5, 2003

(51) Int. Cl.[7] .................................................. H03K 5/19
(52) U.S. Cl. ............................. 327/20; 327/292; 327/18
(58) Field of Search ........................... 327/292, 14, 15, 327/18–20, 24, 27, 77–81, 170, 172, 176, 263, 264, 270, 271, 272, 276, 277, 278, 284, 285

(56) References Cited

U.S. PATENT DOCUMENTS

| | | | | |
|---|---|---|---|---|
| 4,583,008 A | * | 4/1986 | Grugett | 327/15 |
| 4,633,097 A | * | 12/1986 | Dewitt | 327/20 |
| 5,426,390 A | * | 6/1995 | Yabe et al. | 327/172 |
| 5,465,062 A | * | 11/1995 | Fong | 327/172 |
| 5,689,200 A | * | 11/1997 | Ting et al. | 327/78 |
| 5,831,930 A | * | 11/1998 | Hotta | 365/233.5 |
| 5,907,250 A | * | 5/1999 | Baizley et al. | 327/18 |
| 5,926,042 A | * | 7/1999 | Talaga, Jr. | 327/45 |
| 5,936,452 A | * | 8/1999 | Utsuno et al. | 327/292 |
| 6,081,137 A | * | 6/2000 | Choi | 327/43 |
| 6,218,893 B1 | * | 4/2001 | Noguchi | 327/540 |
| 6,418,502 B1 | * | 7/2002 | Larson | 710/306 |

* cited by examiner

*Primary Examiner*—Timothy P. Callahan
*Assistant Examiner*—Hai L. Nguyen
(74) *Attorney, Agent, or Firm*—Rosenthal & Osha L.L.P.

(57) ABSTRACT

A clock detect indicator capable of determining the presence of high and low frequency clock signals is provided. The clock detect indicator, which operates independent of a reference clock, has detection circuitry that determines whether a particular clock signal has alternating high-to-low and low-to-high transitions. Based on the determination, the clock detect indicator outputs a transition on a clock detect indication signal. Further, a method for detecting a clock signal in an integrated circuit is provided.

14 Claims, 6 Drawing Sheets

CLOCK DETECT INDICATOR

BACKGROUND OF INVENTION

Figure 1:
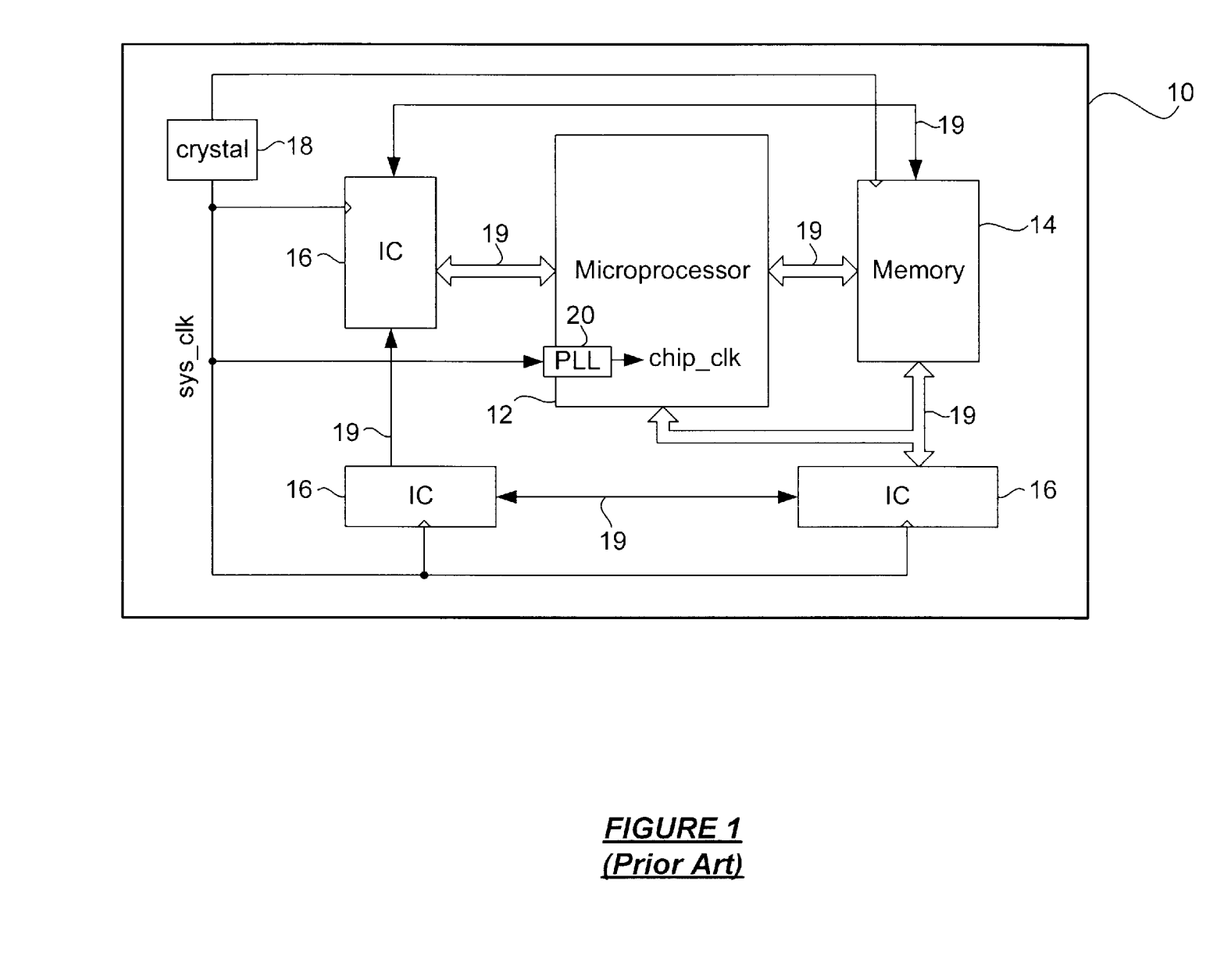
FIG. 1 shows a typical computer system.

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a reference clock signal (referred to and known in the art as "system clock" and shown in FIG. 1 as sys_clk) to various parts of the computer system (10). However, modem microprocessors and other integrated circuits are typically capable of operating at frequencies significantly higher than the signals most clock oscillators can provide, and thus, it becomes important to ensure that operations involving the microprocessor (12) and the other components of the computer system (10) use a proper and accurate reference of time.

One particular component that is heavily depended on by components of a computer system is a type of clock generator known as a phase locked loop, or "PLL" (20). The PLL (20) is an electronic circuit that controls an oscillator such that the oscillator maintains a constant phase relative to a reference signal. Referring to FIG. 1, the PLL (20) inputs the system clock as its reference signal and outputs a chip clock signal (shown in FIG. 1 as chip_clk) to the microprocessor (12), where the system clock and chip clock have a specific phase and frequency relationship controlled by the PLL (20). This relationship between the phases and frequencies of the system clock and chip clock ensures that the various components within the microprocessor (12) use a controlled and accounted for reference of time. In order to ensure that PLL (20) operates accurately, the presence of the system clock provided to the PLL (20) and chip clock generated by the PLL (20) may need to be checked.

It follows that if a particular clock signal necessary to the proper operation of an integrated circuit is not properly generated by a computer system or by a particular integrated circuit, errors in the integrated circuit's operations may lead to errors and malfunction in the operation of the overall computer system. Thus, being able to detect whether a particular clock signal is present is an important and beneficial tool in assessing and improving system performance.

One approach used to detect a clock signal involves passing an AC-coupled clock signal through a clock detection component having a capacitor and an amplifier, where the clock detection circuitry is clocked by a reference clock. The reference clock serves as a basis of time for the operations of the clock detection component. In determining the presence of the clock signal, the AC-coupled clock signal is used to charge and discharge the capacitor, whereafter, the amplifier amplifies a signal coming from the capacitor to generate an output signal of the clock detection component. Using this output signal, one can determine whether the clock signal is present by looking for alternating high-to-low and low-to-high transitions.

Although this approach can detect the presence of a clock signal, the circuitry needed to construct the clock detection component discussed above is large and complex. Consequently, such a clock detection component uses a large amount of area on an integrated circuit and has a high data propagation time. Further, such a clock detection component requires the use of a reference clock. If the reference clock itself is not present, the clock detection component is susceptible to failure and improper operation.

SUMMARY OF INVENTION

According to one aspect of the present invention, a computer system having a component dependent on a clock signal comprises circuitry that generates a transition on a first signal dependent on whether the clock signal is active and circuitry that generates a transition on a clock detect indication signal dependent on the first signal.

According to another aspect, an integrated circuit comprises means for generating a transition on a clock detect signal dependent on whether a clock signal is active and means for indicating that the clock signal is active dependent on the transition on the clock detect signal.

According to another aspect, a method for detecting a clock signal comprises generating a transition on a first signal dependent on whether the clock signal is active and generating a transition on a clock detect indication signal dependent on the transition on the first signal.

Other aspects and advantages of the invention will be apparent from the following description and the appended claims.

DETAILED DESCRIPTION

Embodiments of the present invention relate to an apparatus for detecting a clock signal in an integrated circuit. Embodiments of the present invention further relate to a method for detecting a clock signal in an integrated circuit. Embodiments of the present invention further relate to a computer system having a clock detect indicator component. Embodiments of the present invention further relate to a clock detect indicator probe. Embodiments of the present invention further relate to an apparatus and method for testing and debugging one or more components in an integrated circuit.

Figure 2:
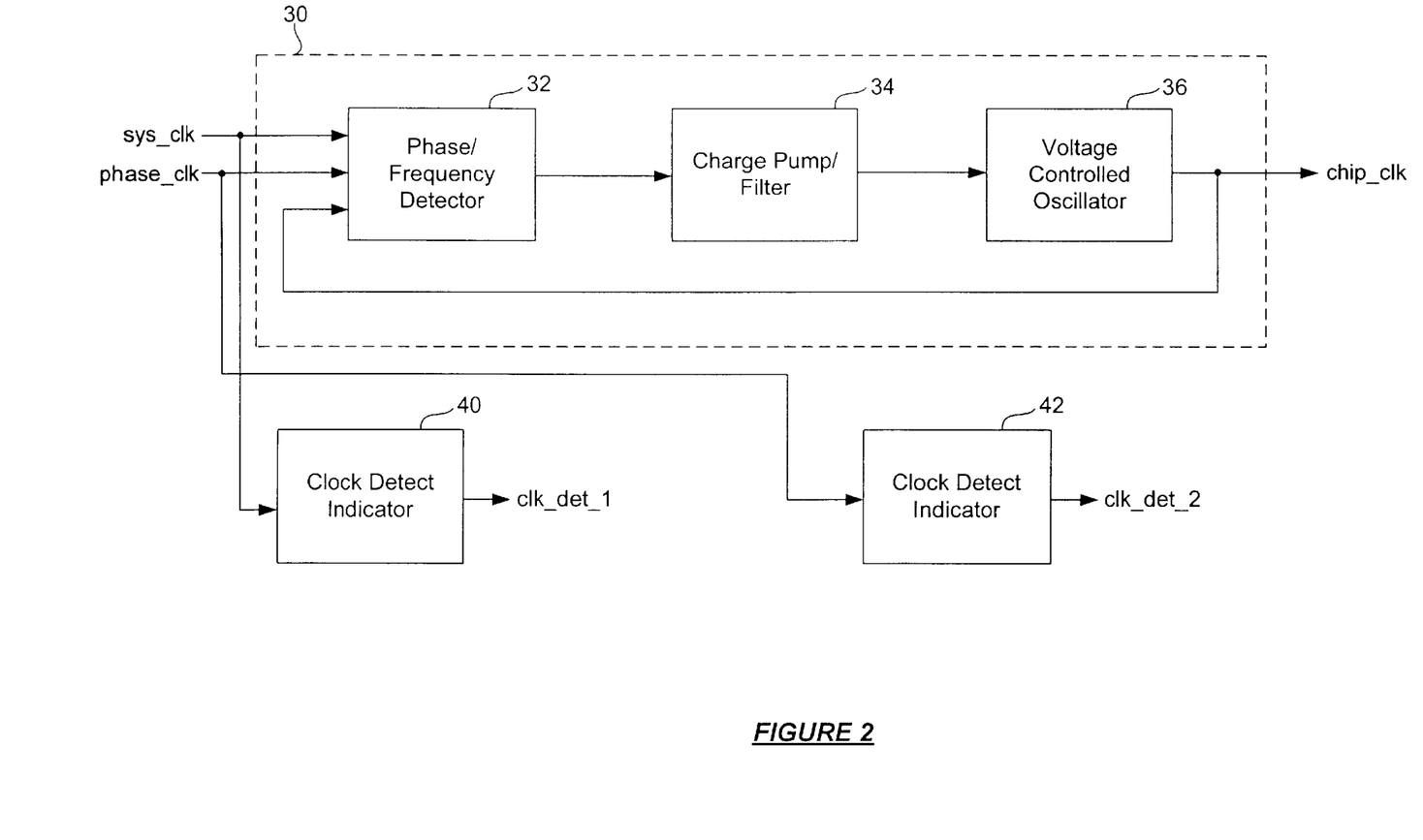
FIG. 2 shows a block diagram in accordance with an embodiment of the present invention.

FIG. 2 shows an exemplary block diagram in accordance with an embodiment of the present invention. Specifically, FIG. 2 shows a PLL (30). A PLL (30) is shown due to the fact that the PLL (30) has several associated clock signals, namely, a system clock (shown in FIG. 2 as sys_clk), a phase clock (shown in FIG. 2 as phase_clk), and a chip clock (shown in FIG. 2 as chip_clk). However, a clock detect indicator in accordance with the present invention may be used for any integrated circuit component that uses a clock signal. Further, the clock detect indicator may be used to detect the presence of a clock signal residing external to any particular integrated circuit component.

In FIG. 2, the PLL (30) has a phase/frequency detector (32), a charge pump/filter (34), and a voltage controlled oscillator (36). The phase/frequency detector (32) inputs the system clock and the chip clock that is fed back from an output of the voltage controlled oscillator (36). The phase/frequency detector (32), depending on whether a phase of the chip clock is lagging or leading a corresponding phase of the system clock, generates pulses on a signal to the charge pump/filter (34).

Then, depending on the signal generated from the phase/frequency detector (32), the charge pump/filter (34) dumps or removes charge to/from a voltage signal to the voltage controlled oscillator (36). Depending on that signal, the voltage controlled oscillator (36) generates the chip clock. The chip clock serves as an output of the PLL (30) as well as a feedback signal to the phase/frequency detector (32).

Still referring to FIG. 2, a first clock detect indicator (40) is positioned to check for the presence of the system clock input to the PLL (30) and a second clock detect indicator (42) is positioned to check for the presence of the phase clock input to the PLL (30). Depending on whether the system clock is present, the first clock detect indicator (40) outputs a pulse on a clock detect signal output (shown in FIG. 2 as clk_det_1), and depending on whether the phase clock is present, the second clock detect indicator (42) outputs a pulse on another clock detect signal output (shown in FIG. 2 as clk_det_2). Note that the positions of the first and second clock detect indicators (40, 42) in FIG. 2 are shown for illustrative purposes, and those skilled in the art will appreciate that in other embodiments, a clock detect indicator may be positioned elsewhere in an integrated circuit to detect for the presence of a particular clock signal not shown in FIG. 2.

Figure 3:
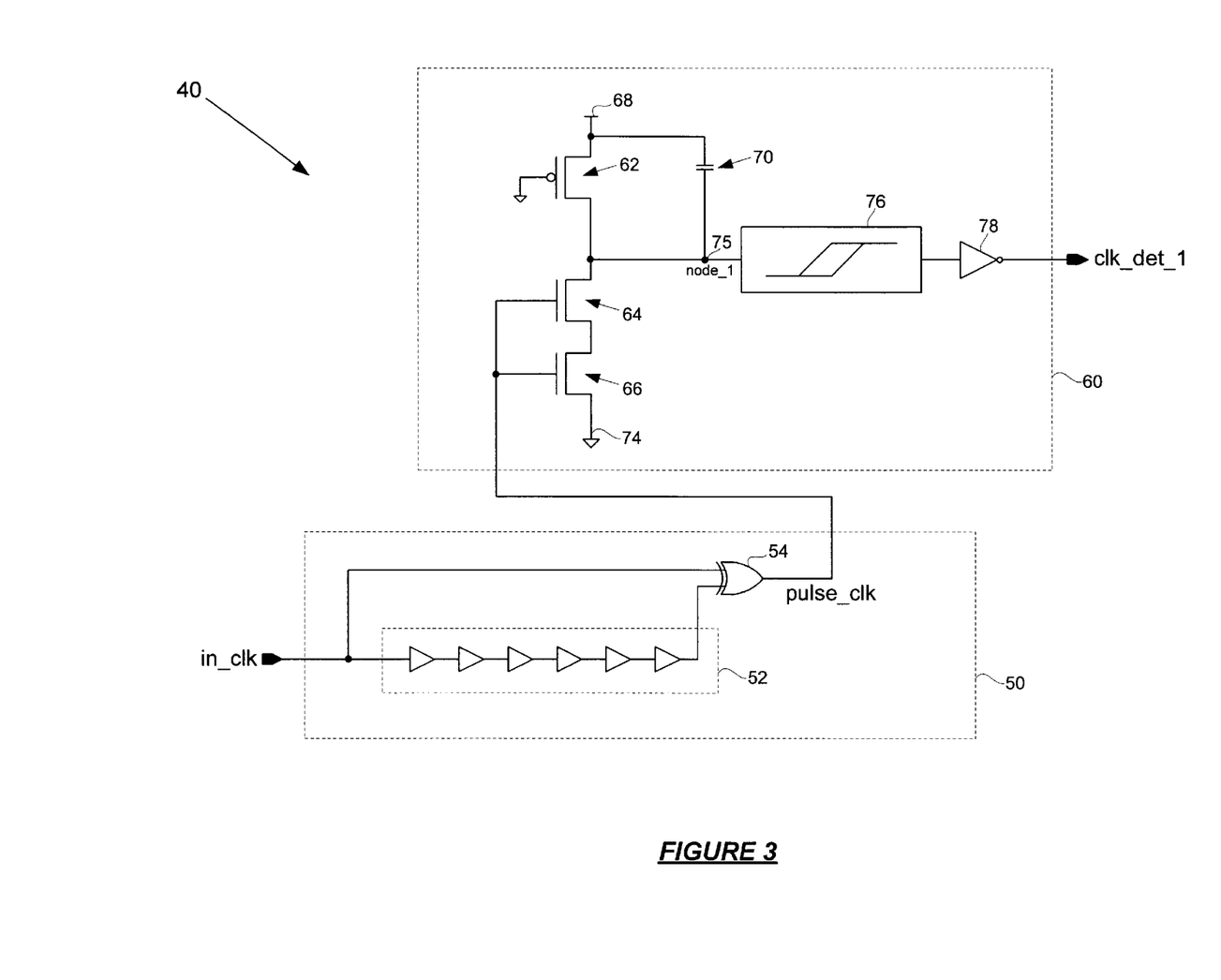
FIG. 3 shows a circuit in accordance with an embodiment of the present invention.

FIG. 3 shows an exemplary circuit in accordance with the first clock detect indicator (40) shown in FIG. 2. In FIG. 3, an input signal (shown in FIG. 3 as in_clk) to an input stage (50) of the clock detect indicator (40) serves as an input to both a delay stage (52) formed by a series of buffers and a first input to an XOR gate (54). If the input signal is not present, i.e., is inactive, the XOR gate (54) outputs low on a pulse signal (shown in FIG. 2 as pulse_clk). However, if the input signal is present, i.e., is active, the XOR gate (54) outputs high on the pulse signal for every rising and falling edge on the input signal.

The pulse signal serves as an input to an output stage (60) of the clock detect indicator (40). The output stage (60) has an inverter formed by a PMOS transistor (62), a first NMOS transistor (64), and a second NMOS transistor (66). A gate terminal of the PMOS transistor (62) is connected to ground, and thus, the PMOS transistor (62) is always 'on.' Alternatively, those skilled in the art will note that the gate terminal of the PMOS transistor (62) may be connected to the pulse clock.

As discussed above, when the input signal is active, the pulse signal goes high. When the pulse signal goes high, the pulse signal, which serves as an input to gate terminals of the first NMOS transistor (64) and the second NMOS transistor (66), switches the first and second NMOS transistors (64, 66) 'on.' In this case, although the PMOS transistor (62), the first NMOS transistor (64), and the second NMOS transistor (66) are all 'on,' the NMOS transistors (64, 66) are designed such that they are larger than the PMOS transistor (62), and thus, current flows from high (68) through a capacitor (70) and the NMOS transistors (64, 66) to ground (74). This flow of current effectively charges the capacitor (70), which, in turn, causes the discharge of a node (shown in FIG. 3 as node_1) (75). The low value on the node (75) serves as an input to a Schmitt trigger (76), which, in turn, outputs low to an inverter (78). The inverter (78) inverts this low value and outputs high on the clock detect output signal (shown in FIG. 3 as clk_det_1). This high pulse on the clock detect output signal indicates that the input signal to the clock detect indicator (40) is present.

However, if the input signal is not present, the pulse signal does not go high as discussed above and instead remains low. In this case, the NMOS transistors (64, 66) are switched 'off' and current flows from high (68) through the 'on' PMOS transistor (62) to the node (75). This effectively discharges the capacitor (70), which, in turn, causes the node (75) to charge up. The high value on the node (75) serves as an input to the Schmitt trigger (76), which, in turn, outputs high to the inverter (78). The inverter (78) inverts this high value and outputs low on the clock detect output signal of the first clock detect indicator (40). As long as the pulse signal is inactive, i.e., is low, the clock detect output signal remains low. This indicates that the input signal to the clock detect indicator (40) is not present.

Note that in order to ensure that the capacitor (70) does not get charged by leakage current through the NMOS transistors (64, 66) when the pulse signal is low, the PMOS transistor (62) may be designed such that the amount of current flow through the 'on' PMOS transistor (62) is significantly higher than the leakage current through the NMOS transistors (64, 66).

Figure 4:
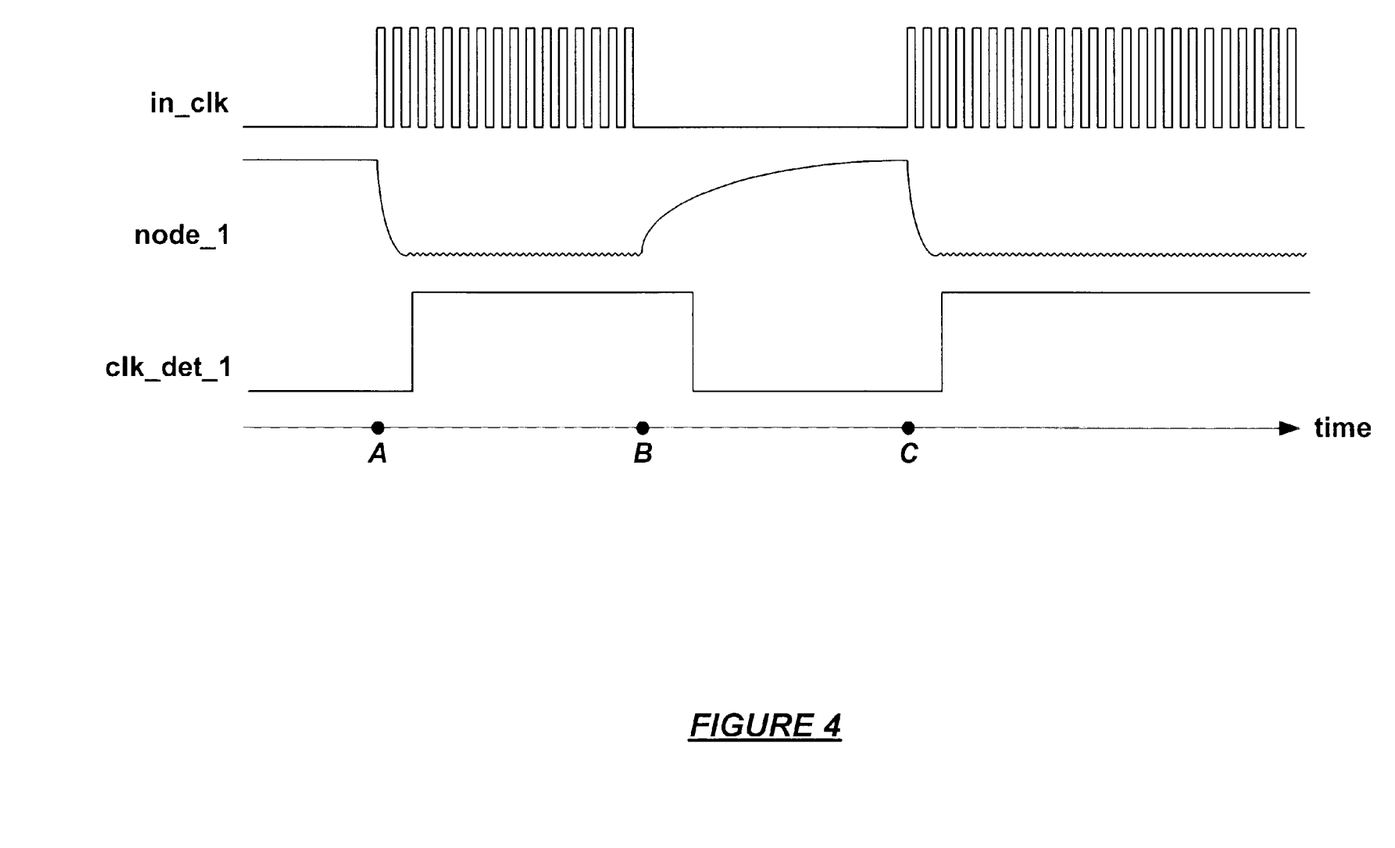
FIG. 4 shows a timing diagram in accordance with the embodiment shown in FIG. 3.

FIG. 4 shows an exemplary timing diagram in accordance with the clock detect indicator (40) shown in FIG. 3. At a point A in time, the input signal (represented in FIG. 4 as in_clk) becomes present. The presence of the input signal causes the pulse signal to go high and switch 'on' the NMOS transistors (64, 66), which, in turn, allows current to flow from high (68) through the capacitor (70) and the NMOS transistors (64, 66) to ground (74). This flow of current effectively charges the capacitor (70) and discharges the node (represented in FIG. 4 as node_1) (75). When the node (75) goes low, the Schmitt trigger (76) outputs low to the inverter (78), which, in turn, outputs high on the clock detect output signal (represented in FIG. 4 as clk_det_1). This high on the clock detect output signal indicates that the input signal is active.

Still referring to FIG. 4, at a point B in time until a point C in time, the input signal becomes inactive. The absence of the input signal causes the pulse signal to go low and switch 'off' the NMOS transistors (64, 66), which, in turn, causes current to flow from high (68) through the 'on' PMOS transistor (62) to the node (75). This flow of current effectively discharges the capacitor (70) and charges the node (75). When the node (75) goes high, the Schmitt trigger (76) outputs high to the inverter (78), which, in turn, outputs low on the clock detect output signal. This low on the clock detect output signal indicates that the input signal is not present.

Now referring back to FIG. 2, the second clock detect indicator (42) detects the presence of the phase clock. Because the phase clock typically has a lower frequency than the system clock, the RC delay of the second clock detect indicator (42) must be increased relative to that of the first clock detect indicator (40). Thus, the second clock detect indicator (42) has cascaded stages to prevent leakage currents associated with larger device sizes associated with high RC delays from controlling the behavior of the circuit. Thus, in order to detect low frequency clock signals, such as a phase clock, another embodiment of a clock detect indicator (42) as shown in FIG. 5 is used.

Figure 5:
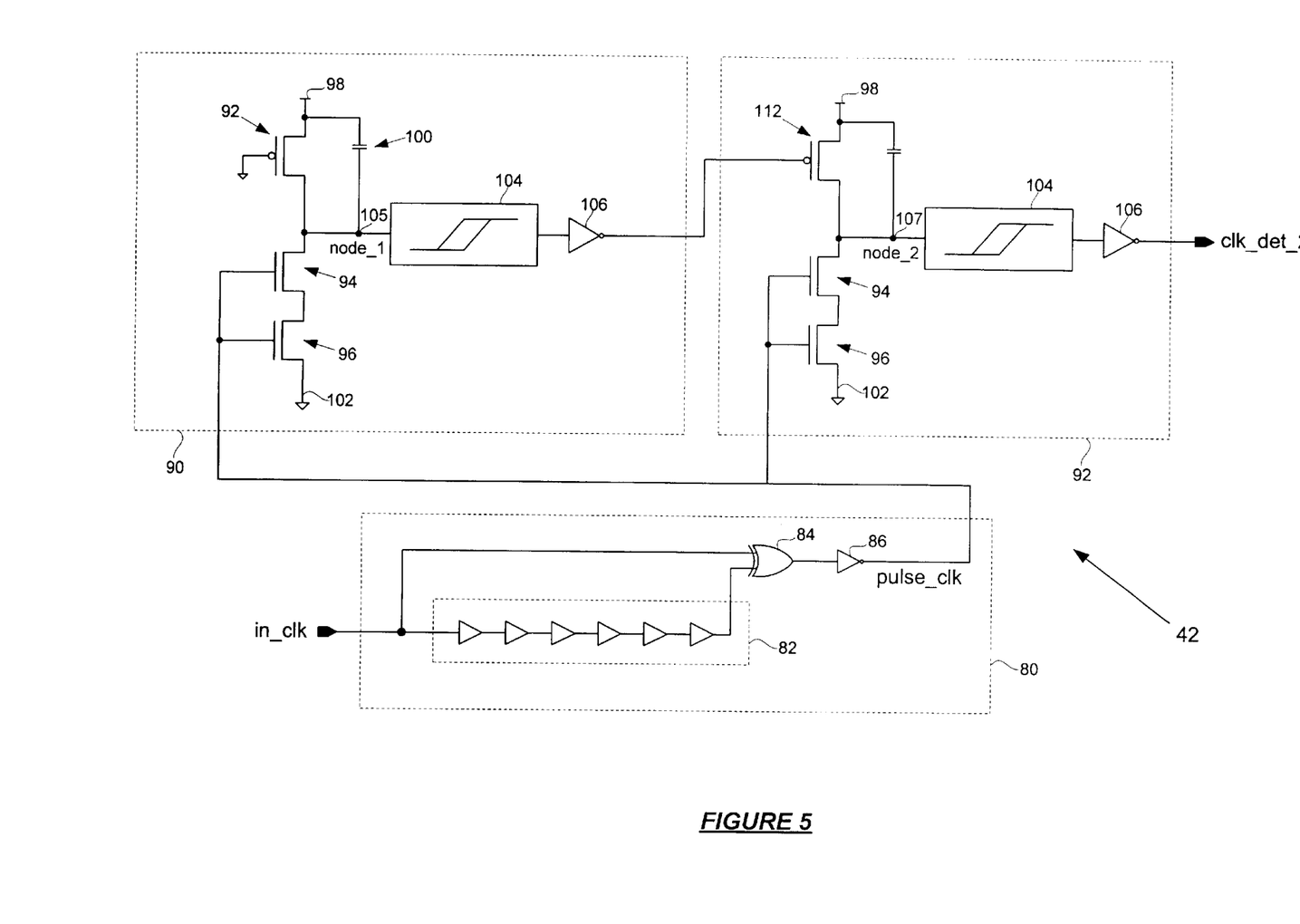
FIG. 5 shows a circuit an accordance with another embodiment of the present invention.

In FIG. 5, an input signal (shown in FIG. 5 as in_clk) to an input stage (80) of the clock detect indicator (42) serves as an input to both a delay stage (82) formed by a series of buffers and a first input to an XOR gate (84). If the input signal is not present, i.e., is inactive, the XOR gate (84) outputs low to an inverter (86), which, in turn, outputs high on a pulse signal (shown in FIG. 5 as pulse_clk). However, if the input signal is present, i.e., is active, the XOR gate (84) outputs high to the inverter (86), which, in turn, outputs low on the pulse signal for every rising and falling edge on the input signal.

The pulse signal serves as an input to a first output stage (90) of the clock detect indicator (42). The first output stage (90) has an inverter formed by a PMOS transistor (92), a first NMOS transistor (94), and a second NMOS transistor (96). A gate terminal of the PMOS transistor (92) is connected to ground, and thus, the PMOS transistor (92) is always 'on.' When the pulse signal goes high due to a presence of the input signal, the first and second NMOS transistors (94, 96) switch 'on,' which, in turn, causes current to flow from high (98) through a capacitor (100) and the NMOS transistors (94, 96) to ground (102). This flow of current effectively charges the capacitor (100) and discharges a first node (shown in FIG. 5 as node_1) (105). When the first node (105) goes low, a Schmitt trigger (104) outputs low to an inverter (106), which, in turn, outputs high to a gate terminal of a PMOS transistor (112) in a second output stage (110) of the clock detect indicator (42), where the second output stage (110) has a configuration similar to that of the first output stage (90).

Because the pulse signal also serves as an input to the second output stage (110), the NMOS transistors (94, 96) in the second output stage (110) are switched 'on,' and current in the second output stage (110) flows from high (98) through a capacitor (100) and NMOS transistors (94, 96) to ground (102). This flow of current in the second output stage (110) effectively charges the capacitor (100) and discharges a second node (shown in FIG. 5 as node_2) (107). As the second node (107) goes low, a Schmitt trigger (104) outputs low to an inverter (106), which, in turn, outputs high on a clock detect output signal (shown in FIG. 5 as clk_det_2). This high on the clock detect output signal indicates that the input signal to the clock detect indicator (42) is present.

However, if the input signal is not present, the pulse signal does not go high as discussed above and instead remains low. In this case, the NMOS transistors (94, 96) remain switched 'off' and current in the first output stage (90) flows from high (98) through the 'on' PMOS transistor (92) to the first node (105). This effectively discharges the capacitor (100), which, in turn, causes the first node (105) to charge up. The high value on the first node (105) serves as an input to the Schmitt trigger (104), which, in turn, outputs high to the inverter (106). The inverter (106) inverts this high value and outputs low to the gate terminal of the PMOS transistor (112) in a second output stage (110).

Because the pulse signal also serves as an input to the second output stage (110), the NMOS transistors (94, 96) in the second output stage (110) are switched 'off,' and current in the second output stage (110) flows from high (98) through the 'on' PMOS transistor (112) to the second node (107). This flow of current in the second output stage (110) effectively discharges the capacitor (100) and charges the second node (107). As the second node (107) goes high, the Schmitt trigger (104) outputs high to the inverter (106), which, in turn, outputs low on the clock detect output signal. This low on the clock detect output signal indicates that the input signal to the clock detect indicator (42) is not present.

Figure 6:
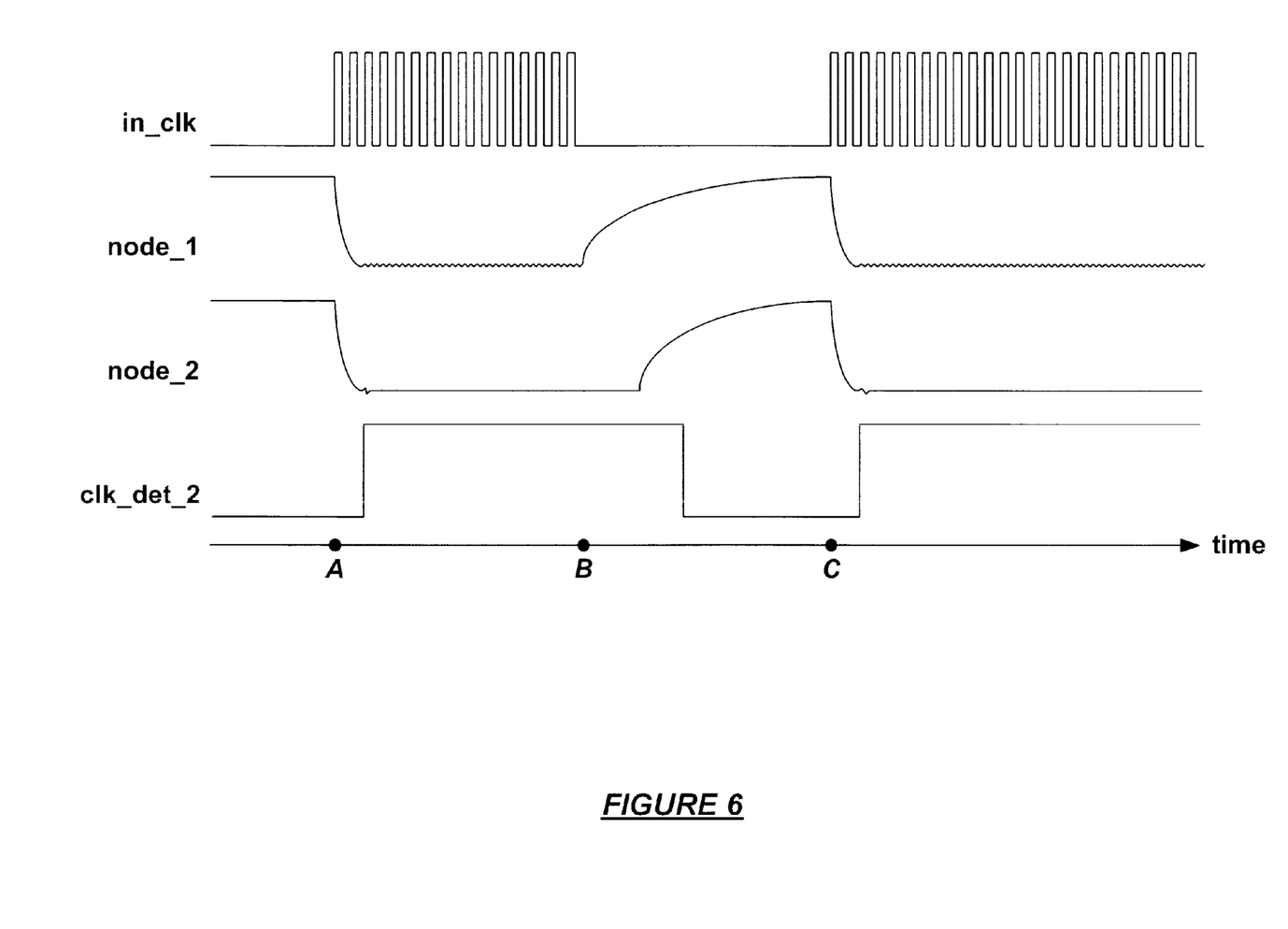
FIG. 6 shows a timing diagram in accordance with the embodiment shown in FIG. 5.

FIG. 6 shows an exemplary timing diagram in accordance with the clock detect indicator (42) shown in FIG. 5. At a point A in time, the input signal (represented in FIG. 6 as in_clk) becomes present. The presence of the input signal causes the pulse signal to go high and switch 'on' the NMOS transistors (94, 96) in the first and second output stages (90, 110). When the NMOS transistors (94, 96) in the first output stage (90) switch 'on,' current in the first output stage (90) flows from high (98) through the capacitor (100) and NMOS transistors (94, 96) to ground (102). This flow of current effectively charges the capacitor (100) and discharges the first node (represented in FIG. 6 as node_1) (105). When the first node (105) goes low, the Schmitt trigger (104) outputs low to the inverter (106), which, in turn, outputs high to the gate terminal of the PMOS transistor (112) in the second output stage (110).

In this case, the high at the gate terminal of the PMOS transistor (112) causes the PMOS transistor (112) to switch 'off,' and thus, current in the second output stage (110) flows from high (98) through the capacitor (100) and NMOS transistors (94, 96) to ground (102). This flow of current in the second output stage (110) effectively charges the capacitor (100) in the second output stage (110) and discharges the second node (represented in FIG. 6 as node_2) (107). When the second node (107) goes low, the Schmitt trigger (104) outputs low to the inverter (106), which, in turn outputs high on the clock detect signal output signal (represented in FIG. 6 as clk_det_2). This high on the clock detect output signal is indicative of the input signal being present.

Still referring to FIG. 6, at a point B in time until a point C in time, the input signal becomes inactive. The absence of the input signal causes the pulse signal to go low and switch 'off' the NMOS transistors (94, 96) in the first and second output stages (90, 110). As the NMOS transistors (94, 96) in the first output stage (90) switch 'off,' current flows from high (98) through the 'on' PMOS transistor (92) to the first node (105). This flow of current effectively discharges the capacitor (100) and charges the first node (105). When the first node (105) goes high, the Schmitt trigger (104) outputs high to the inverter (106), which, in turn, outputs low to the gate terminal of the PMOS transistor (112) in the second output stage (110).

In this case, the low at the gate terminal of the PMOS transistor (112) causes the PMOS transistor (112) to switch 'on,' and thus, current in the second output stage (110) flows from high (98) through the 'on' PMOS transistor (112) to the second node (107). This flow of current in the second output stage (110) effectively discharges the capacitor (100) in the second output stage (110) and charges the second node (107). When the second node (107) goes high, the Schmitt trigger (104) outputs high to the inverter (106), which, in turn outputs low on the clock detect signal output signal. This low on the clock detect output signal is indicative of the input signal not being present.

In other embodiments of the present invention, the clock detect indicator circuitry shown in FIGS. 3 and 5 can be implemented in a clock detect probe for probing a particular point within an integrated circuit to determine whether a clock signal at that point is active.

Advantages of the present invention may include one or more of the following. In some embodiments, because a clock detect indicator can detect the presence of a clock signal, circuit functionalities may be assessed, tested, and/or debugged in order to improve system performance.

In some embodiments, because an absence of a clock signal may be detected, an integrated circuit may be powered off before massive crow bar currents between power and ground cause severe damage to the integrated circuit. Thus, using the present invention, a designer may fully power up an integrated circuit only after he/she has determined that necessary clock signals are active.

In some embodiments, because a clock detect indicator is not dependent on a reference clock, the clock detector is not susceptible to errors caused by reference clock uncertainty and/or inactivity.

In some embodiments, because a clock detect indicator can be designed with a high RC time constant, the clock detect indicator may be used to detect low frequency clock signals.

In some embodiments, because a clock detect indicator can be designed for use with high frequency clock signals, adverse performance effects resulting from leakage currents associated with high frequency operation may be reduced or eliminated.

In some embodiments, because an RC time constant of a clock detect indicator can be increased by duplicating particular circuitry in the clock detect indicator, the clock detect indicator may be implemented without a need for a redesign of the circuitry used to construct the clock detect indicator.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system having a component dependent on a clock signal, comprising:
   first circuitry that generates a transition on a first signal dependent on whether the clock signal is active; and
   second circuitry that generates a transition on a clock detect indication signal dependent on the first signal, comprising:
      a first capacitor coupled to a first node,
         wherein current flows along one of a first current path and a second current path dependent on the transition on the first signal, wherein the first current path is defined as a path from the first node to ground, and wherein the second current path is defined as a path from a power supply to the first node,
      wherein the first capacitor is charged and the first node is discharged when current flows along the first current path, and
      wherein the first capacitor is discharged and the first node is charged when current flows along the second current path.

2. The computer system of claim 1, wherein the circuitry that generates the transition on the first signal comprises:
   delay circuitry that generates a delayed clock signal based on the clock signal, and
   logic circuitry that generates the transition on the first signal when the delayed clock signal and the clock signal are complementary.

3. The computer system of claim 1, wherein the circuitry that generates the transition on the clock detect indication signal further comprises:
   output circuitry that generates the transition on the clock detect indication signal dependent on a value of the first node.

4. The computer system of claim 1, wherein the circuitry that generates the transition on the clock detect indication signal further comprises:
   output circuitry that generates a transition on a second signal dependent on a value of the first node;
   circuitry that provides a second current path dependent on the transition on the second signal, and
   a second capacitor coupled to a second node, wherein the second capacitor is charged and the second node is discharged when current flows along the second current path.

5. The computer system of claim 4, wherein the circuitry that generates the transition on the clock detect indication signal further comprises:
   output circuitry that generates the transition on the clock detect indication signal dependent on a value of the second node.

6. The computer system of claim 5, wherein the circuitry that generates the transition on the clock detect indication signal further comprises:
   circuitry that provides a third current path dependent on the transition on the second signal, wherein the second capacitor is discharged and the second node is charged when current flows along the third current path.

7. An integrated circuit, comprising:
   means for generating a transition on a signal dependent on whether a clock signal is active; and
   means for indicating that the clock signal is active dependent on the transition on the signal, comprising:
      means for propagating a first current dependent on the transition on the signal,
      means for storing a charge dependent on the first current, wherein the means for storing the charge has a terminal connected to a supply voltage, and
      means for propagating a second current dependent on the transition on the signal, wherein the means for storing the charge is discharged dependent on the second current.

8. A method for detecting a clock signal, comprising:
   generating a transition on a first signal dependent on whether the clock signal is active, comprising:
      establishing a first current path dependent on the transition on the first signal, wherein a first capacitor is charged and a first node is discharged when current flows along the first current path, and
      establishing a second current path dependent on the transition on the first signal, wherein the first capacitor is discharged and the first node is charged when current flows along the second current path,
      wherein the first current path is defined as a path from the first node to ground, and wherein the second current path is defined as a path from a power supply to the first node; and
   generating a transition on a clock detect indication signal dependent on the transition on the first signal.

9. The method of claim 8, wherein generating the transition on the first signal comprises:
   generating a delayed clock signal based on the clock signal, and generating the transition on the first signal when the delayed clock signal and the clock signal are complementary.

10. The method of claim 8, wherein generating the transition on the clock detect indication signal further comprises:
    generating the transition on the clock detect indication signal dependent on a value of the first node.

11. The method of claim 8, wherein generating the transition on the clock detect indication signal further comprises:

generating a transition on a second signal dependent on a value of the first node, and establishing a second current path dependent on the transition on the second signal.

12. The method of claim 11, wherein a second capacitor is charged and a second node is discharged when current flows along the second current path.

13. The method of claim 12, wherein generating the transition on the clock detect indication signal further comprises:

generating the transition on the clock detect indication signal dependent on a value of the second node.

14. The method of claim 12, wherein the circuitry that generates the transition on the clock detect indication signal further comprises:

establishing a third current path dependent on the transition on the second signal, wherein the second capacitor is discharged and the second node is charged when current flows along the third current path.

* * * * *